United States Patent [19]

Nishitsuji

[11] Patent Number: 5,440,174
[45] Date of Patent: Aug. 8, 1995

[54] PLURALITY OF PASSIVE ELEMENTS IN A SEMICONDUCTOR INTEGRATED CIRCUIT AND SEMICONDUCTOR INTEGRATED CIRCUIT IN WHICH PASSIVE ELEMENTS ARE ARRANGED

[75] Inventor: Mitsuru Nishitsuji, Osaka, Japan

[73] Assignee: Matsushita Electric Industrial Co., Ltd., Osaka, Japan

[21] Appl. No.: 73,907

[22] Filed: Jun. 9, 1993

[30] Foreign Application Priority Data

Oct. 20, 1992 [JP] Japan .................. 4-281392

[51] Int. Cl.⁶ ............... H01L 23/48; H01L 29/40; H01L 27/02; H01L 29/68
[52] U.S. Cl. .................. 257/770; 257/758; 257/767; 257/536; 257/310
[58] Field of Search ............. 257/758, 536, 537, 31, 257/32, 33, 34, 35, 36, 379, 310, 532, 533, 489, 300, 303, 308, 383, 767, 770

[56] References Cited

U.S. PATENT DOCUMENTS

| | | | |
|---|---|---|---|
| 3,138,744 | 6/1964 | Kilby | 257/300 |
| 3,289,093 | 11/1966 | Wanlass | 257/300 |
| 3,655,544 | 4/1972 | Rairden, III | 204/192 |
| 3,781,610 | 12/1973 | Bodway | 257/533 |
| 4,335,505 | 6/1982 | Shibata et al. | 257/300 |
| 4,458,295 | 7/1984 | Durschlag et al. | 257/537 |
| 4,786,612 | 11/1988 | Yan et al. | 257/537 |
| 4,876,176 | 10/1989 | Calviello et al. | 257/379 |
| 4,891,684 | 1/1990 | Nishioka et al. | 257/310 |
| 5,068,694 | 11/1991 | Ohara | 257/31 |
| 5,187,557 | 2/1993 | Zenke | 257/310 |
| 5,187,638 | 2/1993 | Sandhu et al. | 257/310 |
| 5,310,695 | 5/1994 | Suzuki | 437/60 |

FOREIGN PATENT DOCUMENTS

| | | |
|---|---|---|
| 60-5555 | 1/1985 | Japan . |
| 63-202951 | 8/1988 | Japan . |
| 03203261 | 9/1991 | Japan .................. 257/532 |

OTHER PUBLICATIONS

"RF Sputtered Strontium Titanate Films" by W. B. Pennebaker; IBM J. Res. Develop. Nov. 1969; pp. 686-695.

Primary Examiner—Rolf Hille
Assistant Examiner—Teresa M. Arroyo
Attorney, Agent, or Firm—Lowe, Price, LeBlanc & Becker

[57] ABSTRACT

A method consists of the steps of depositing a Ti—Pt metal film on a SiN layer insulation film mounted on GaAs substrate, etching the Ti—Pt metal film to form a first metal layer, depositing a $SrTiO_3$ insulating film, etching the $SrTiO_3$ insulating film to form an insulating film, depositing a WSiN metal film according to a sputtering technique while controlling a deposition pressure of nitrogenous gas, etching the WSiN metal film to simultaneously form a second metal layer on the insulating film and a thin metal film resistive element on the SiN layer insulation film, depositing a $SiO_2$ passivation film, and making via holes. $SrTiO_3$ has a high relative dielectric constant, and WSiN has a high melting point. Nitrogen atoms in WSiN prevent oxygen atoms in the insulating film from diffusing into the second metal layer. The adhesion of second metal film to the insulating film is tight because of the sputtering technique. The resistance of the thin metal film resistive element is stable because of nitrogen atoms strongly bonded to tungsten atoms and silicon atoms.

7 Claims, 7 Drawing Sheets

PLURALITY OF PASSIVE ELEMENTS IN A SEMICONDUCTOR INTEGRATED CIRCUIT AND SEMICONDUCTOR INTEGRATED CIRCUIT IN WHICH PASSIVE ELEMENTS ARE ARRANGED

BACKGROUND OF THE INVENTION

1. 1. Field of the Invention

The present invention relates generally to a method for manufacturing a plurality of passive elements in a semiconductor integrated circuit, and more particularly to a method for manufacturing a metal-insulator-metal capacitative element and a thin metal film resistive element in the same process in a semiconductor integrated circuit. Also, the present invention relates to a semiconductor integrated circuit in which the passive elements manufactured according to the method are arranged.

2. Description of the Related Art

In a semiconductor integrated circuit, various types of passive elements such as a capacitative element and a resistive element are integrated. The capacitative element such as a metal-insulator-metal capacitative element is generally manufactured by laminating a first metal layer, an insulating film, and a second metal layer in that order.

2.1. First Prior Art

For example, the insulating film consists conventionally of Silicon Nitride (SiN) in a compound semiconductor integrated circuit. In this case, a relative dielectric constant $\epsilon r$ of SiN is no more than 7.2. Therefore, a large area is required to manufacture a capacitative element having a capacity $C=S*\epsilon r/d$ such as a several tens pF value (the symbol S denotes an area of the capacitative element and the symbol d denotes a film thickness of the insulating film). As a result, an area occupied by a semiconductor integrated circuit is increased, and a manufacturing cost of the semiconductor integrated circuit is increased.

To solve the above drawbacks, the application of an insulating material having a comparatively high relative dielectric constant $\epsilon r$ to the capacitative element has been recently proposed. For example, a tantalum oxide film of which a relative dielectric constant $\epsilon r$ ranges from 22 to 25 has been proposed (Japanese Patent Application No. 113218 of 1983 laid open to public inspection on Jan. 12, 1985 under Provisional Publication No. 5555/85). However, in cases where the tantalum oxide film is utilized as the insulating film of the metal-insulator-metal capacitative element in place of a SiN film, leakage current flowing between the first and second metal layers through the tantalum oxide film is increased as compared with that in the SiN film. Therefore, the film thickness of the tantalum oxide film is required to be twice or three times as thick as that of the SiN film. As a result, an area $S_{Ta}$ occupied by the capacitative element in which the tantalum oxide film is laminated is the same as another area $S_{SiN}$ occupied by the capacitative element in which the SiN film is laminated.

To solve the above drawback, the application of an insulating film consisting of titanium oxide (Ti-oxide) to the capacitative element has been recently proposed. A relative dielectric constant $\epsilon r$ of Ti-oxide is generally larger than that of Ta-oxide such as tantalum oxide because a relative displacement of a titanium atom to an oxygen atom in a perovskite structure is greatly larger than that of a tantalum atom to an oxygen atom. That is, a dipole moment in Ti-oxide is larger than that in Ta-oxide. Specifically, in cases where $SrTiO_3$ is utilized as a Ti-oxide insulating film, a relative dielectric constant $\epsilon r$ of $SrTiO_3$ ranges from 100 to 300. In other words, the relative dielectric constant $\epsilon r$ of $SrTiO_3$ is fourteen times to forty-two times as large as that of SiN. Also, leakage current flowing through a $SrTiO_3$ film is easily suppressed by increasing the film thickness of the $SrTiO_3$ film. That is, an increased film thickness of the $SrTiO_3$ film is no more than four times as large as the film thickness of the SiN film to decrease density of the leakage current to $10^{-6}$ A/cm$^2$ or below. As a result, an area $S_{Ti}$ occupied by the capacitative element in which the $SrTiO_3$ film is laminated is decreased to a range from 1/3.5 to 1/10.5 as compared with the area $S_{SiN}$.

Accordingly, the reduction of the area occupied by the capacitative element can be achieved. In addition, Curie temperature of $SrTiO_3$ is about 75° K. and is considerably low. Therefore, a polarization reversal is not observed in $SrTiO_3$ in cases where the capacitative element is operated at an ordinary temperature. Accordingly, the application of the $SrTiO_3$ film to the capacitative element is proper for a circuit in which signals are transferred in a high-frequency band such as a band over 1 GHz.

The selection of a material of the insulating film is described as a first prior art in the above description.

2.2 Second Prior Art

Next, a second prior art is described.

In cases where a plurality of passive elements are arranged in a semiconductor integrated circuit, not only a capacitative element but also a resistive element are generally arranged on a substrate.

FIGS. 1A to 1J are sectional views showing a series of conventional processes for manufacturing a capacitative element and a resistive element on a substrate.

In cases where a capacitative element and a resistive element are manufactured on a layer insulation film 11 deposited on a substrate 12, a first metal film 13 is initially deposited over the entire layer insulation film 11 in a first process as shown in FIG. 1A. Thereafter, the first metal film 13 is etched to a prescribed pattern to form a first metal layer 13a according to a photolithography technique in a second process as shown in FIG. 1B. Thereafter, an insulating film 14 is deposited over entire surfaces of the first metal layer 13a and the layer insulation film 11 in a third process as shown in FIG. 1C. Thereafter, the insulating film 14 is etched to a prescribed pattern to form an insulating film 14a on the first metal layer 13a in a fourth process as shown in FIG. 1D. Thereafter, a second metal film 15 is deposited over entire surfaces of the insulating film 14a, the first metal layer 13a and the layer insulation film 11 in a fifth process as shown in FIG. 1E. Thereafter, the second metal film 15 is etched to a prescribed pattern to form a second metal layer 15a on the insulating film 14a in a sixth process as shown in FIG. 1F. Therefore, a capacitative element 16 consisting of the first metal layer 13a, the insulating film 14a, and the second metal layer 15a is formed.

Thereafter, a thin metal film 17 is deposited over entire surfaces of the second metal layer 15a, the first metal layer 13a and the layer insulation film 11 in a seventh process as shown in FIG. 1G. Thereafter, the thin metal film 17 is etched to a prescribed pattern to form a thin metal film resistor 17a on the layer insulating film 11 in an eighth process as shown in FIG. 1H. The thin metal film resistor 17a functions as the resistive element. Thereafter, a passivation film 18 is deposited over entire surfaces of the second metal layer 15a, the first metal layer 13a, the layer insulation film 11, and the thin metal film resistor 17a in a ninth process as shown in FIG. 1I. Finally, the passivation film 18 is etched to make a plurality of via holes 19 through which each of wires is connected with the second metal layer 15a, the first metal layer 13a, or the thin metal film resistor 17a in a tenth process as shown in FIG. 1J.

Therefore, the seventh and eighth processes are additionally required to arrange the thin metal film resistor 17a in cases where the capacitive element 16 and the thin metal film resistor 17a are independently deposited on the substrate 12.

2.3. Problems to be Solved by the Invention

However, there are many drawbacks in the first prior art. That is, when heat treatment is performed for the capacitative element after the first metal layer, the SrTiO3 film, and the second metal layer are deposited in that order, thermal reaction is generated between the SrTiO3 film and the second metal layer. As a result, leakage current between the first and second metal films through the SrTiO3 film is remarkably increased.

FIG. 2A is a sectional view of a conventional capacitative element manufactured on a semiconductor chip. FIG. 2B is an enlarged sectional view showing dislocation of oxygen atoms from a SrTiO3 thin film to a second metal layer in the conventional capacitative element shown in FIG. 2A.

As shown in FIGS. 2A, 2B, a conventional capacitative element 21 consists of a first metal layer 22 deposited on a substrate 23, a SrTiO3 thin film 24 deposited on the first metal layer 22, and a second metal layer 25 deposited on the SrTiO3 thin film 24. The second metal layer 25 consists of a metal material such as Ti, Ni, or Al which is easily oxidized. In the above configuration, because the SrTiO3 thin film 24 functions as an insulating film, the conventional capacitative element 21 functions as a capacitor. When heat treatment is performed for the capacitative element 21 at a temperature of several hundreds degrees C after the capacitative element 21 is manufactured, oxygen ions 26 bonded to Sr ions or Ti ions in the SrTiO3 thin Film 24 are freed and diffused into the second metal layer 25 (W. B. Pennebaker, IBM Journal of Research and Development, 13, 686(1969)). Therefore, the second metal layer 25 is oxidized, and lattice defects 27 in which oxygen ions 26 are lost are generated. As a result, electrons are transferred from the first metal layer 22 (or the second metal layer 25) to the second metal layer 25 (or the first metal layer 22) through the lattice defects 27 of the SrTiO3 thin film 24.

FIG. 3 graphically shows a relationship between density Ic(A/cm$^2$) of leakage current flowing through the SrTiO3 thin film 24 and intensity E(V/cm) of electric field applied to the capacitative element 21.

As shown in FIG. 3, leakage current flowing through the SrTiO3 thin film 24 is comparatively high even though intensity E(V/cm) of electric field applied to the capacitative element 21 is low. That is, density of the leakage current is more than $10^{-2}$ A/cm$^2$ in cases where the lattice defects 27 are generated in the SrTiO3 thin film 24. The density of the leakage current is maintained at $10^{-6}$ A/cm$^2$ or below in cases where any lattice defect 27 is not generated in the SrTiO3 thin film 24. Also, when the intensity E(V/cm) of the electric field is increased to 0.35 V/cm, a dielectric breakdown is generated in the capacitative element 21.

Accordingly, an insulating property of the capacitative element 21 deteriorates, and the capacitative element 21 cannot be useful for practical use.

To solve the above drawback, the application of nonreactive noble metals such as Au and Pt to the second metal layer 25 has been proposed. Because the noble metals Au and Pt are non-reactive, the oxygen ions 26 bonded in the SrTiO3 thin film 24 are not diffused into the second metal layer 25 consisting of Au or Pt. However, adhesion of the noble metals to the insulating film 24 is low. Therefore, in cases where a passivation film is deposited on the capacitative element 21, a so-called membrane stress is generated between the passivation film and the second metal layer consisting of Au or Pt after a while. As a result, the second metal layer 25 comes off the SrTiO3 thin film 24 so that yield rate of the semiconductor integrated circuits deteriorates. Also, crevices penetrating the passivation film and the second metal layer 25 are produced so that an insulation property of the capacitative element 21 is varied by a moist atmosphere. In addition, in cases where ultrasonic cleaning is performed for the capacitative element 21, the second metal layer 25 comes off the SrTiO3 thin film 24 because the adhesion of the noble metals to the insulating film 24 is low.

Also, to decrease the number of processes in the second prior art shown in FIGS. 1A to 1J, there is a first conventional method in which the thin metal film resistor 17a is deposited together with the second metal layer 15. In this case, the control of a film thickness of the thin metal film resistor 17a is required to adjust the resistance of the thin metal film resistor 17a. However, because sheet resistance $\rho_s$ ($\Omega\square$) of the noble metal such as Au or Pt is considerably low, the sheet resistance $\rho_s$ is, for example, less than 1 $\Omega/\square$ on condition that the film thickness of the thin metal film resistor 17a is 50 nm. Therefore, the film thickness and a film width of the thin metal film resistor 17a is required to be controlled with high accuracy in cases where the thin metal film resistor 17a having a high resistance is required. Also, the resistance of the thin metal film resistor 17a has an upper limit. Accordingly, there are many drawbacks in the first conventional method as to the resistance control of the thin metal film resistor 17a and the reproductivity of the thin metal film resistor 17a in cases where the noble metal is deposited to simultaneously produce the thin metal film resistor 17a and the second metal layer 15a.

Also, there is a second conventional method in which the thin metal film resistor 17a is produced together with another metal layer (not shown) in a single process to decrease the number of processes shown in FIGS. 1A to 1J. For example, the thin metal film resistor 17a is deposited together with a gate electrode (Japanese Patent Application No. 34494 of 1987 laid open to public inspection on Aug. 22, 1988 under Provisional Publication No. 202951/88). However, because an annealing process is performed at an annealing temperature of about 800° C. to activate injected ions after the thin metal film resistor 17a is deposited together with the gate electrode, nitrogen content of the thin metal film resistor 17a is considerably increased. Therefore, the resistance of the thin metal film resistor 17a is varied. Accordingly, the resistance of the thin metal film resistor 17a cannot be adjusted with high accuracy in the second conventional method.

Also, there is a third conventional method in which the thin metal film resistor is produced together with the first metal layer 13a in a single process. However, a surface of the thin metal film resistor 17a is damaged when the SrTiO3 thin film 14a is processed. Therefore, the resistance of the thin metal film resistor 17a is varied. Accordingly, the resistance of the thin metal film resistor 17a cannot be adjusted with high accuracy in the third conventional method.

SUMMARY OF THE INVENTION

A first object of the present invention is to provide, with due consideration to the drawbacks of such a conventional method, a method for manufacturing a small-sized capacitative element while maintaining the adhesion of a second metal layer to an insulating film in the capacitative element without increasing leakage current.

A second object of the present invention is to provide a method for manufacturing a small-sized capacitative element and a resistive element of passive elements while adjusting the resistance of the resistive element with high accuracy in a wide range and maintaining the adhesion of a second metal layer to an insulating film in the capacitative element without increasing leakage current.

A third object of the present invention is to provide a semiconductor integrated circuit in which a small-sized capacitative element and a resistive element manufactured according to the above method are arranged.

The first object is achieved by the provision of a method for manufacturing a capacitative element, comprising the steps of:

preparing a semiconductor substrate;

depositing a first metal layer on the semiconductor substrate;

depositing an insulating film consisting of a Ti-oxide on the first metal layer; and depositing a second metal layer consisting of a refractory metal which does not reduce the insulating film, the capacitative element consisting of the first metal layer, the insulating film, and the second metal layer deposited on the insulating film.

In the above steps, the first metal layer, the insulating film, and the second metal layer are deposited in that order to form the capacitative element. The insulating film consisting of the Ti-oxide has a high relative dielectric constant εr ranging from 100 to 300. Also, leakage current flowing through the insulating film is easily suppressed by increasing the film thickness of the insulating film in some degree. Therefore, the size of the capacitative element can be minimized.

Also, the second metal layer consists of the refractory metal and does not reduce the insulating film. Therefore, even thought the second metal layer is highly heat up by heat treatment, any thermal reaction between the second metal layer and the insulating film is effectively prevented, and no lattice defect is generated in the insulating film. As a result, the leakage current flowing through the insulating film is stably suppressed.

Accordingly, the capacitative element stably functions as a capacitor, and yield rate of the capacitative element can be increased.

It is preferred that the step of depositing a second metal layer include depositing atoms of metal in a nitrogenous gas according to a sputtering technique to bond nitrogen atoms to the atoms of metal, the second metal layer tightly adhering to the insulating film.

In the above steps, the nitrogen atoms are bonded to the atoms of metal in the second metal layer. In other words, bond energy of nitrogen atoms to the atoms of metal is large. Therefore, oxygen atoms included in the insulating film are prevented from being bonded to the atoms of metal in the second metal layer while disconnecting the nitrogen atoms from the atoms of metal. As a result, no lattice defect is generated in the second metal layer so that the increase of the leakage current can be prevented. Accordingly, the capacitative element can stably function as a capacitor.

In addition, the adhesion of the second metal layer to the insulating film is enhanced because the second metal layer is deposited on the insulating film according to the sputtering technique. Also, membrane stress generated between the insulating film and the second metal film is suppressed by nitrogen atoms included in the second metal layer. Therefore, the second metal layer does not come off the insulating film even though a passivation film is deposited on the second metal film or ultrasonic cleaning is performed for the capacitative element. Accordingly, yield rate of the capacitative element can be increased.

The second object is achieved by the provision of a method for manufacturing a capacitative element and a resistive element, comprising the steps of:

preparing a semiconductor substrate;

depositing a first metal layer on the semiconductor substrate;

depositing an insulating film consisting of a Ti-oxide on the first metal layer;

depositing a thin metal film on the insulating film and the semiconductor substrate, the thin metal film consisting of a refractory metal which does not reduce the insulating film; and etching the thin metal film to simultaneously produce both a second metal layer deposited on the insulating film and a thin metal resistive element deposited on the semiconductor substrate, the capacitative element consisting of the first and second metal layers and the insulating film.

In the above steps, the first metal layer, the insulating film, and the thin metal film are deposited in that order. Thereafter, the thin metal film is etched to produce the second metal layer deposited on the insulating film and the thin metal resistive element deposited on the semiconductor substrate. In this case, because the second metal layer and the thin metal resistive element are simultaneously produced, processes required to manufacture the capacitative element and the resistive element can be decreased.

Also, the insulating film consisting of the Ti-oxide has a high relative dielectric constant εr ranging from 100 to 300, and leakage current flowing through the insulating film is easily suppressed by increasing the film thickness of the insulating film in some degree. Therefore, the size of the capacitative element can be minimized.

Also, the thin metal film consists of the refractory metal and does not reduce the insulating film. Therefore, even thought the thin metal film is highly heat up by heat treatment, any thermal reaction between the thin metal film and the insulating film is effectively prevented, and no lattice defect is generated in the insulating film. As a result, the leakage current flowing through the insulating film is stably suppressed.

Accordingly, the capacitative element stably functions as a capacitor, and yield rate of the capacitative element can be increased.

It is preferred that the step of depositing a thin metal film include:

controlling a pressure of a nitrogenous gas; and depositing atoms of metal in the nitrogenous gas according to a sputtering technique to bond nitrogen atoms to the atoms of metal, the second metal layer tightly adhering to the insulating film.

In the above steps, because the thin metal resistive element including the nitrogen atoms has a large sheet resistance $\rho_s$, the resistance of the thin metal resistive element can be easily set to a prescribed value in a wide range without minutely adjusting the film thickness and the film width of the thin metal resistive element.

Also, because a composition of the thin metal resistive element including the nitrogen atoms is stable, the resistance of the thin metal resistive element is stable even though heat treatment is performed for the thin metal resistive element.

Also, the nitrogen atoms are bonded to the atoms of metal in the second metal layer. In other words, bond energy of nitrogen atoms to the atoms of metal is large. Therefore, oxygen atoms included in the insulating film are prevented from being bonded to the atoms of metal in the second metal layer while disconnecting the nitrogen atoms from the atoms of metal. As a result, no lattice defect is generated in the second metal layer so that the increase of the leakage current can be prevented. Accordingly, the capacitative element can function as a capacitor.

In addition, the adhesion of the second metal layer to the insulating film is enhanced because the thin metal film is deposited on the insulating film according to the sputtering technique. Also, membrane stress generated between the insulating film and the second metal film is suppressed by nitrogen atoms included in the second metal layer. Therefore, the second metal layer does not come off the insulating film even though a passivation film is deposited on the second metal film or ultrasonic cleaning is performed for the capacitative element. As a result, yield rate of the capacitative element can be increased.

Accordingly, even though the second metal layer and the thin metal film resistive element are simultaneously deposited and etched, the capacitative element can reliably function as a capacitor, and the thin metal film resistive element can reliably function as a resistor.

The third object is achieved by the provision of a semiconductor integrated circuit, comprising:

a semiconductor substrate;

a first metal layer mounted on the semiconductor substrate;

an insulating film which consists of a Ti-oxide and is mounted on the first metal layer, the Ti-oxide having a high relative dielectric constant;

a second metal layer mounted on the insulating film, the second metal layer consisting of a refractory metal which does not reduce the insulating film; and a thin metal film resistive element mounted on the semiconductor substrate, the thin metal film resistive element consisting of the refractory metal, the thin metal film resistive element being mounted on the semiconductor substrate at the same time that the second metal layer is mounted on the insulating film.

In the above configuration, the insulating film is arranged between the first and second metal layers. Therefore, a capacitative element consisting of the first and second layers and the insulating film is formed. In this case, because the Ti-oxide of the insulating film has a high relative dielectric constant, an area occupied by the capacitative element can be minimized.

Also, because the second metal layer and the thin metal film resistive element are simultaneously produced, a series of processes required to manufacture the semiconductor integrated circuit can be simplified.

Also, the second metal layer consists of the refractory metal and does not reduce the insulating film. Therefore, even thought the second metal layer is highly heat up by heat treatment, any thermal reaction between the second metal layer and the insulating film is effectively prevented, and no lattice defect is generated in the insulating film. As a result, the leakage current flowing through the insulating film is stably suppressed.

Accordingly, the capacitative element stably functions as a capacitor, and yield rate of the capacitative element can be increased.

It is preferred that the refractory metal of the second metal layer be formed of a nitrogenous material having a high melting point, nitrogen atoms bonded to atoms of metal in the second metal layer preventing oxygen atoms included in the insulating film from diffusing into the second metal layer.

In the above configuration, because nitrogen atoms in the second metal layer are tightly bonded to atoms of metal, the second metal layer is not oxidized by oxygen atoms of the insulating film. Therefore, no lattice defect is generated in the insulating film so that leakage current in the insulating film can be minimized.

Also, because the nitrogenous material has a high resistance, the resistance of the thin metal film resistive element can be easily adjusted to a prescribed value without minutely adjusting the shape of the thin metal film resistive element. Also, because a composition of the thin metal film resistive element is stable, the resistance of the thin metal film resistive element is stable even though heat treatment is performed for the thin metal film resistive element.

Accordingly, even though the second metal layer and the thin metal film resistive element are simultaneously produced, the capacitative element can reliably function as a capacitor, and the thin metal film resistive element can reliably function as a resistor.

BRIEF DESCRIPTION OF THE DRAWINGS

The objects, features and advantages of the present invention will be apparent from the following description taken in conjunction with the accompanying drawings, in which:

FIG. 2B is a enlarged sectional view showing dislocation of oxygen atoms from a $SrTiO_3$ thin film to a second metal layer in the conventional capacitative element shown in FIG. 2A;

DETAIL DESCRIPTION OF THE PREFERRED EMBODIMENTS

Preferred embodiments of a method for manufacturing a plurality of passive elements in a semiconductor integrated circuit according to the present invention are described with reference to drawings.

FIGS. 4A to 4H are sectional views showing a series of processes for manufacturing a capacitative element and a resistive element on a substrate in the same process according to a first embodiment of the present invention.

Figure 1A:
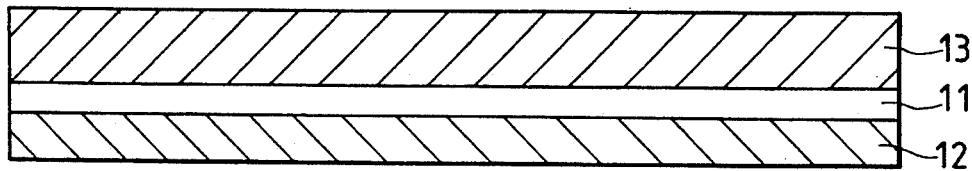
FIGS. 1A to 1J are sectional views showing a series of conventional processes for manufacturing a capacitative element and a thin metal film resistor on a substrate.
Figure 1B:
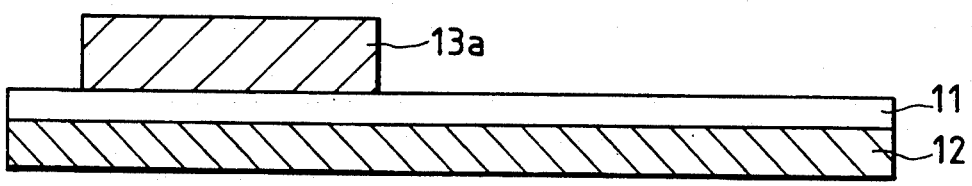
Figure 1C:
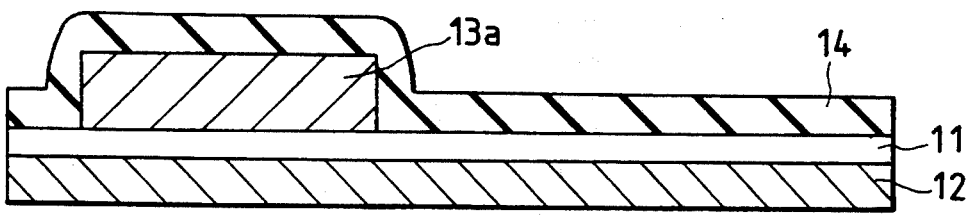
Figure 1D:
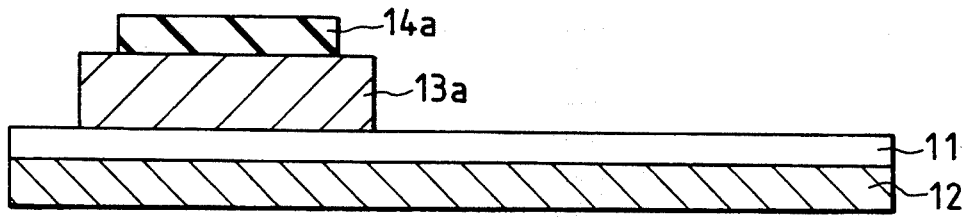
Figure 1E:
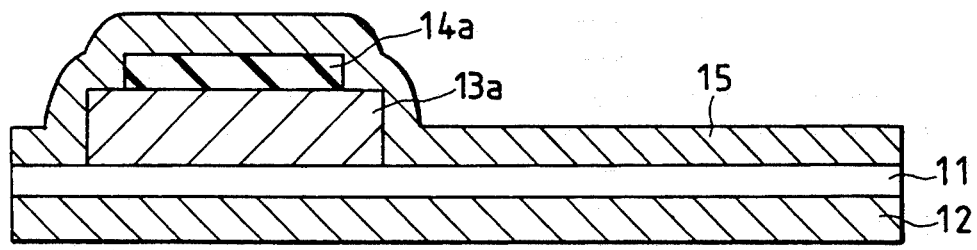
Figure 1F:
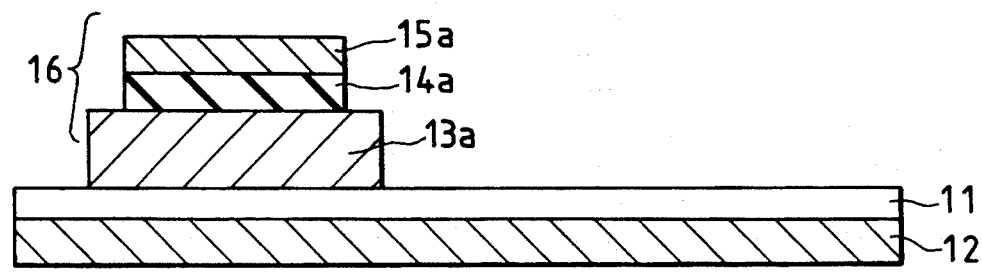
Figure 1G:
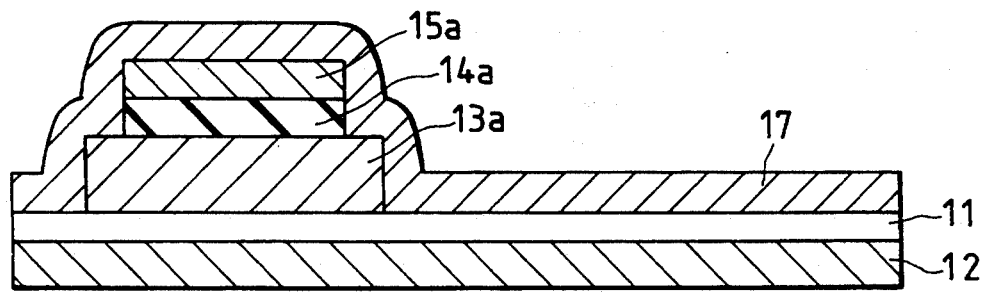
Figure 1H:
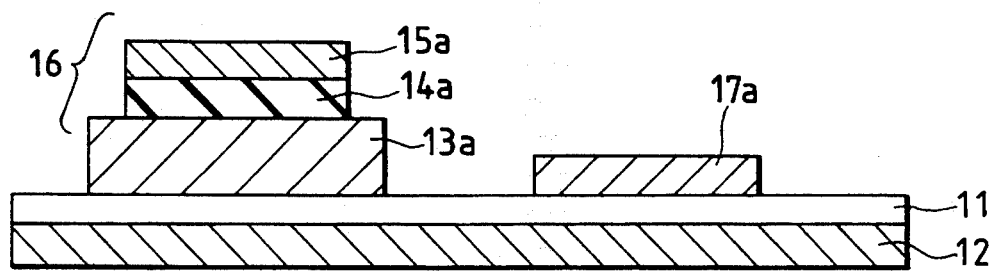
Figure 1I:
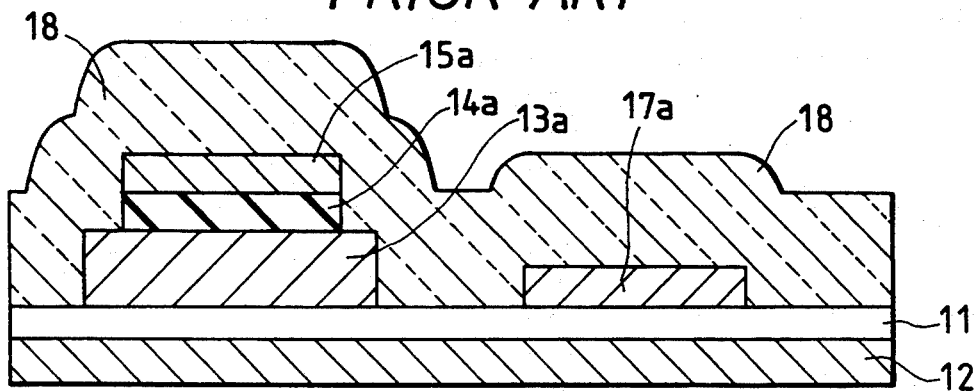
Figure 1J:
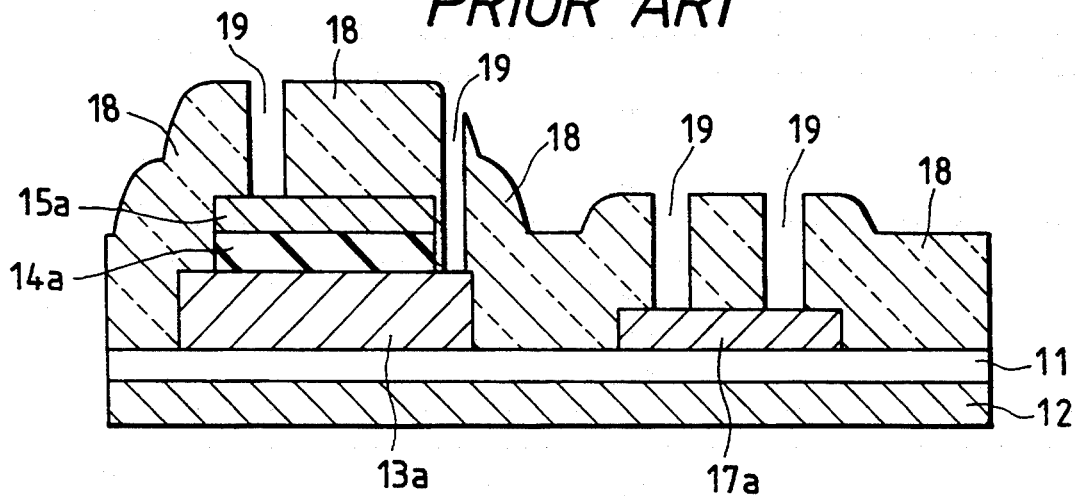
Figure 2A:
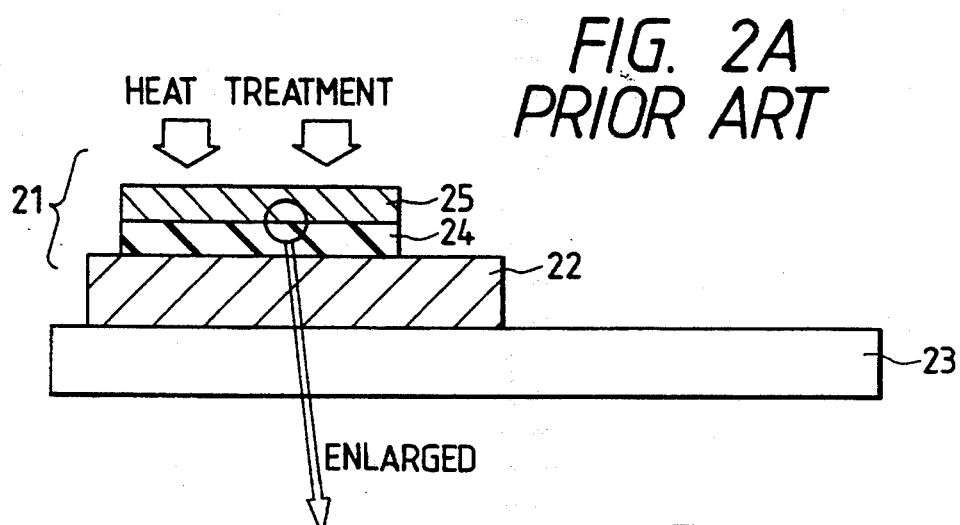
FIG. 2B is a sectional view of a conventional capacitative element manufactured on a semiconductor chip.
Figure 2B:
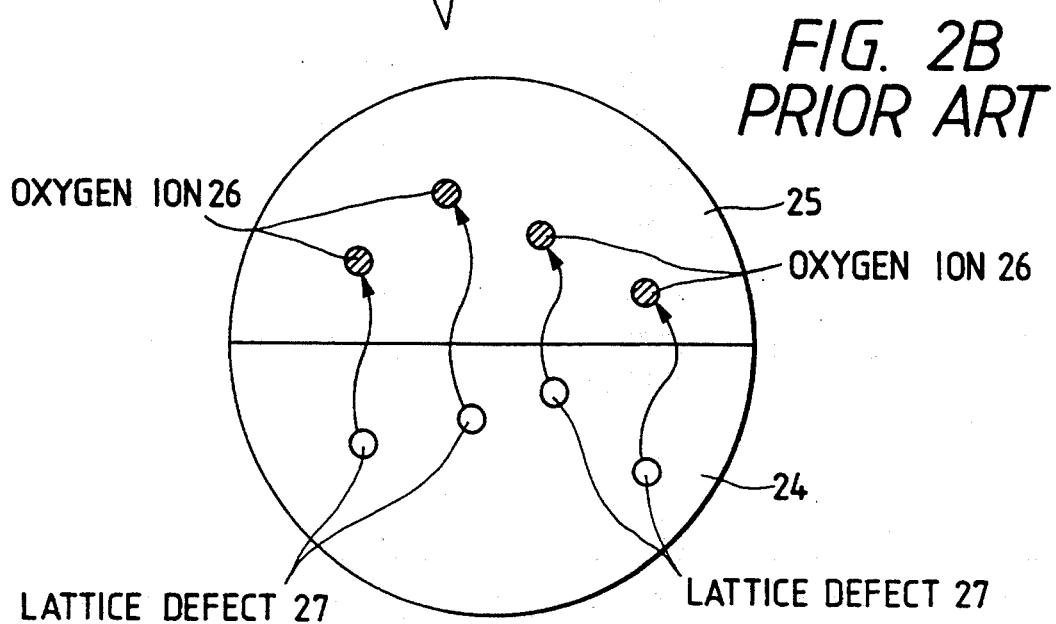
Figure 3:
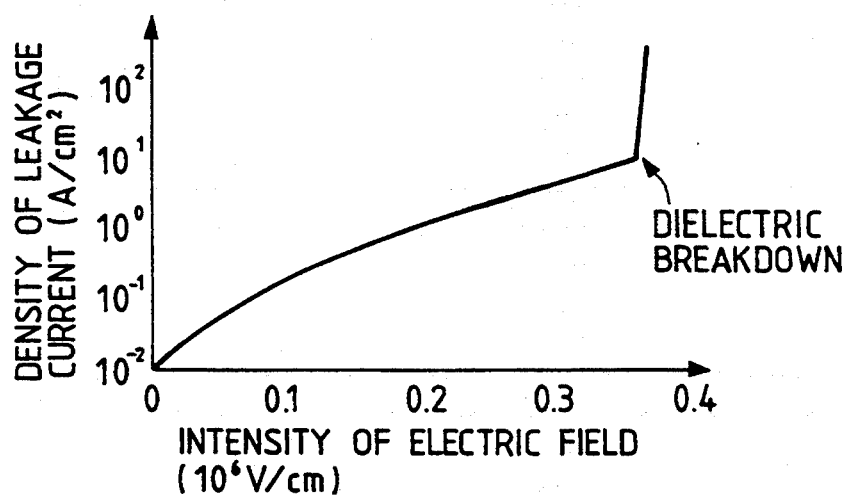
FIG. 3 graphically shows a relationship between density $Ic(A/cm^2)$ of leakage current flowing through a $SrTiO_3$ thin metal film shown in FIG. 2A and intensity $E(V/cm)$ of electric field applied to the capacitative element shown in FIG. 2A.
Figure 4A:
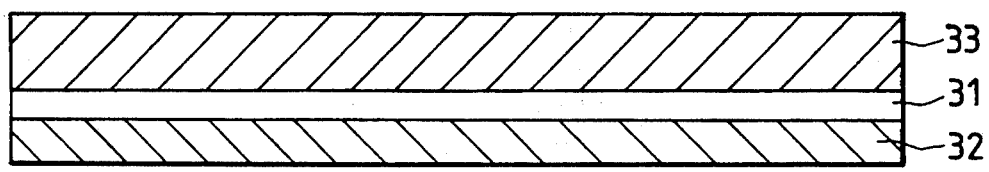
FIGS. 4A to 4H are sectional views showing a series of processes for manufacturing a capacitative element and a thin metal film resistor on a substrate in the same process, according to a first embodiment of the present invention.
Figure 4B:
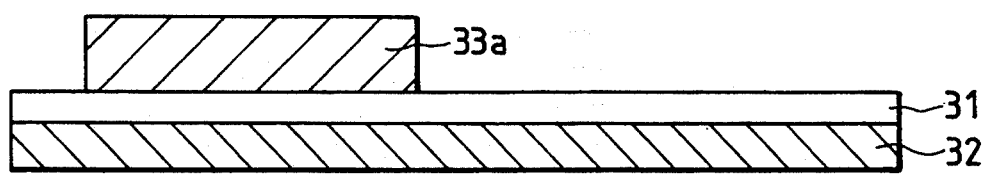
Figure 4C:
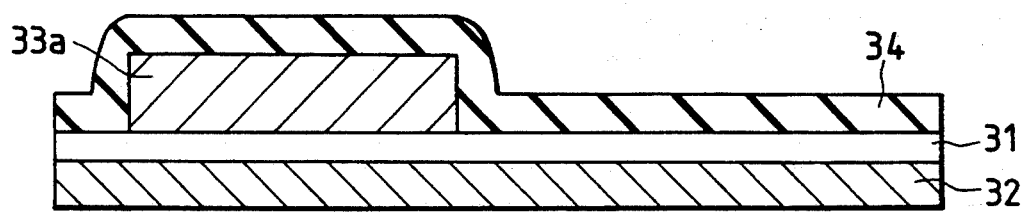
Figure 4D:
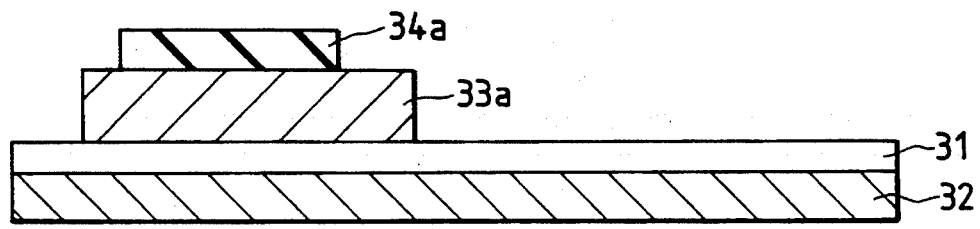

After a layer insulation film 31 consisting of SiN is deposited on a GaAs substrate 32, a first metal film 33 consisting of Ti and Pt is deposited over the entire layer insulation film 31 in a first process as shown in FIG. 4A. Thereafter, the first metal film 33 is etched according to a photolithography technique to form a first metal layer 33a in a second process as shown in FIG. 4B. Thereafter, an insulating film 34 consisting of SrTiO$_3$ is deposited over the entire first metal layer 33a and the layer insulation film 31 in a third process as shown in FIG. 4C. Thereafter, the insulating film 34 is etched to form an insulating film 34a on the first metal layer 33a in a fourth process as shown in FIG. 4D.

Figure 4E:
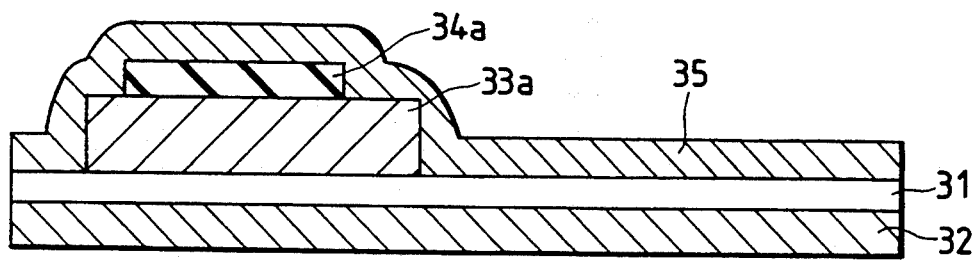

Thereafter, as shown in FIG. 4E, a thin metal film 35 consisting of WSiN is deposited on the insulating film 34a, the first metal layer 33a, and the layer insulation film 31 in a fifth process while sputtering tungsten silicide (WSi) in mixed gas of nitrogen and argon. The thin metal film 35 including nitrogen atoms such as WSiN is classified as a refractory metal so that the film 35 has a high melting point. The film thickness of the thin metal film 35 is 100 nm. In this case, nitrogen content of the thin metal film 35 is adjusted by controlling a deposition pressure of the mixed gas so that the sheet resistance $\rho_s$ of the thin metal film 35 is adjusted with high accuracy. For example, the sheet resistance $\rho_s$ of the thin metal film 35 is adjusted in a range from 60 Ω/□ to 1000 Ω/□ when the deposition pressure of the nitrogen gas is varied from 5 mTorr to 25 mTorr on condition that the film thickness of the thin metal film 35 is 100 nm. Also, the sheet resistance $\rho_s$ of the thin metal film 35 is adjusted by changing a flow rate of nitrogen gas to argon gas.

The adhesion of the thin metal film 35 to the insulating film 34a is enhanced because the thin metal film 35 is injected into the insulating film 34a according to a sputtering technique and because a so-called membrane stress generated between the thin metal film 35 and the insulating film 34a is suppressed by nitrogen atoms of the thin metal film 35. Also, the thin metal film 35 does not reduce the insulating film 34a. Specifically, thermal reaction between the thin metal film 35 and the insulating film 34a is suppressed because oxygen atoms included in the insulating film 34a are prevented from being bonded to tungsten atoms or silicon atoms in the thin metal film 35 while disconnecting the nitrogen atoms from the tungsten atoms or the silicon atoms. In short, the tungsten atoms and the silicon atoms tightly bonded to the nitrogen atoms are prevented from being oxidized.

Figure 4F:
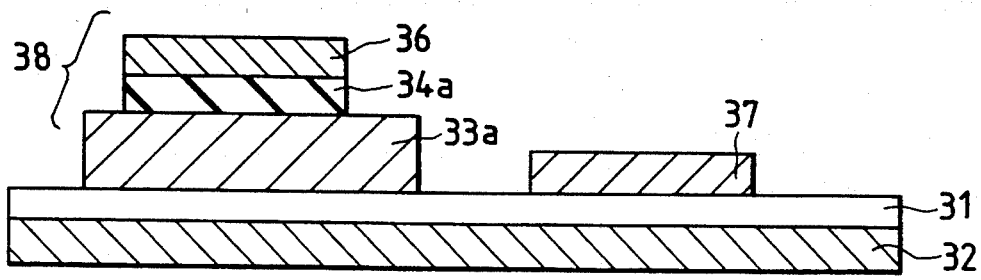
Figure 4G:
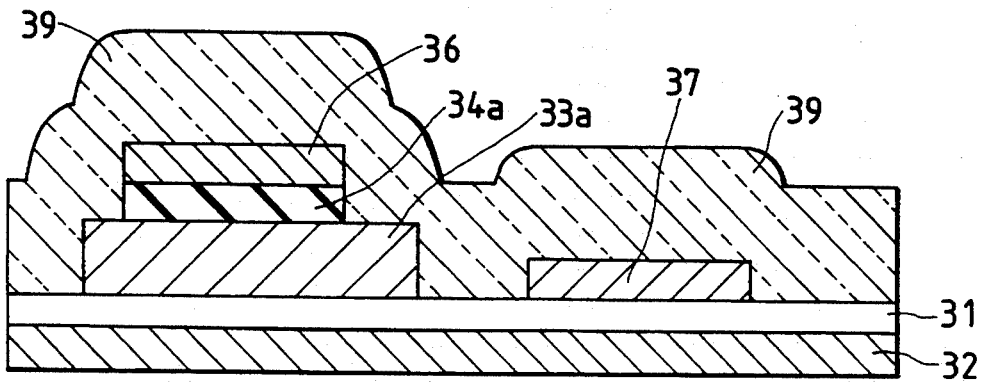
Figure 4H:
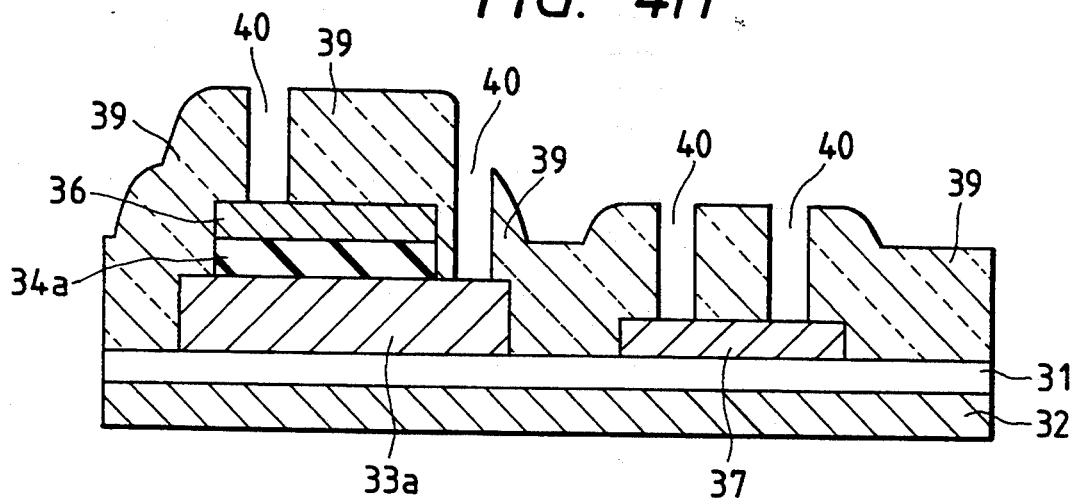

Thereafter, as shown in FIG. 4F, the thin metal film 35 is etched by CF$_4$ ions according to a dry etching technique to form both a second metal layer 36 on the insulating film 34a and a thin metal film resistor 37 on the layer insulation film 31 in a sixth process. Therefore, the capacitative element 38 consisting of the first and second metal layers 33a, 36 and the insulating film 34a is formed. Also, the thin metal film resistor 37 functions as the resistive element. Thereafter, as shown in FIG. 4G, a passivation film 39 consisting of SiO$_2$ is deposited on the second metal layer 36, the thin metal film resistor 37, the insulating film 34a, the first metal layer 33a, and the layer insulation film 31 in a seventh process. A film thickness of the passivation film 39 is 500 nm, and a deposition temperature of the passivation film 39 is about 300° C. Thereafter, as shown in FIG. 4H, a plurality of via holes 40 passing through the passivation film 39 are made with HF liquid according to a wet etching technique in an eighth process. The via holes 40 are arranged on the first and second metal layers 33a, 36 and the thin metal film resistor 37. Therefore, in cases where conductive wires are connected to the first and second metal layers 33a, 36 through the via holes 40, the capacitative element 38 functions as a capacitor.

Accordingly, because the second metal layer 36 and the thin metal film resistor 37 are simultaneously produced, only eight processes are required to manufacture the capacitative element 38 and the thin metal film resistor 37. Therefore, the number of processes required in the present invention can be lowered by two as compared with that in the conventional method shown in FIGS. 1A to 1J.

Also, the passivation film 39 is deposited on the thin metal film resistor 37 at the deposition temperature of about 300° C. which is comparatively lower than the annealing temperature of about 800° C. described in the prior art, and all of tungsten atoms and silicon atoms are tightly bonded to nitrogen atoms in the thin metal film 35. Therefore, even though the passivation film 39 is deposited on the thin metal film resistor 37, the composition of the thin metal film resistor 37 is not changed. Also, because the thin metal film resistor 37 is produced after the insulating film 34a is etched, a surface of the thin metal film resistor 37 is not damaged. Accordingly, the resistance of the thin metal film resistor 37 can be adjusted with high accuracy. In addition, because the sheet resistance $\rho_s$ of the thin metal film 35 is adjusted in a range from 60 Ω/□ to 1000 Ω/□ which is greatly higher than that of the noble metal described in the prior art, the resistance of the thin metal film resistor 37 can be adjusted in a wide range.

Figure 5:
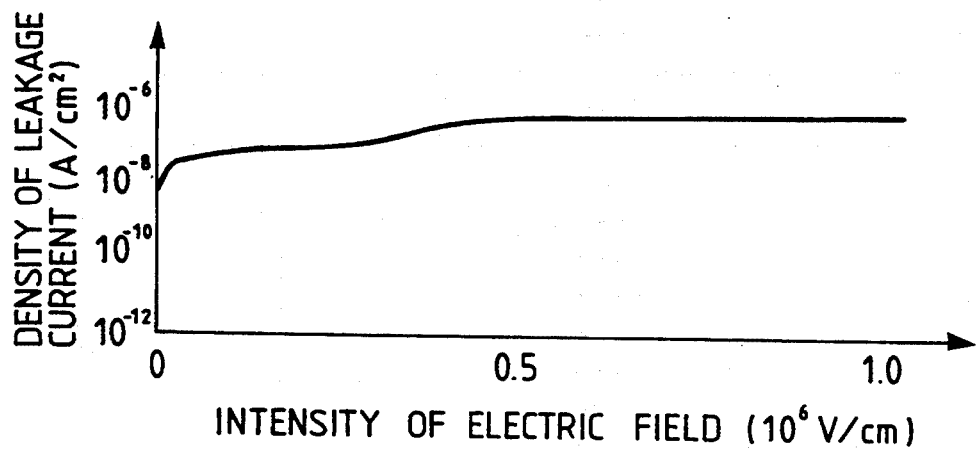
FIG. 5 graphically shows a relationship between density Ic(A/cm$^2$) of leakage current flowing through a SrTiO$_3$ insulating film shown in FIG. 4H and intensity E(V/cm) of electric field applied to the capacitative element shown in FIG. 4H.

FIG. 5 graphically shows a relationship between density Ic(A/cm$^2$) of leakage current flowing through the SrTiO$_3$ insulating film 34a shown in FIG. 4H and intensity E(V/cm) of electric field applied to the capacitative element 38 shown in FIG. 4H.

In cases where the second metal layer 36 consisting of WSiN is deposited on the SrTiO$_3$ insulating film 34a, as shown in FIG. 5, a relationship between density Ic(A/cm$^2$) of leakage current flowing through the SrTiO$_3$ insulating film 34a and intensity E(V/cm) of electric field applied to the capacitative element 38 is obtained after heat treatment is performed for the capacitative element 38 at a temperature of 300° C. for fifteen minutes in an argon atmosphere. In this case, the leakage current is maintained in a range from $10^{-8}$ A/cm$^2$ to $10^{-6}$ A/cm$^2$ even though the intensity of the electric field reaches $1.0 \times 10^6$ V/cm. The reason is because all of tungsten atoms and silicon atoms are tightly bonded to nitrogen atoms in the second metal layer 36 so that no heat reaction is generated between the SrTiO$_3$ insulating film 34a and the second metal layer 36. Accordingly, the capacitative element 38 can reliably function as a capacitor.

Also, the adhesion of the second metal layer 36 to the insulating film 34a is enhanced because the thin metal film 35 is deposited on the insulating film 34a according to the sputtering technique and because the membrane stress generated between the second metal layer 36 and the insulating film 34a is suppressed by nitrogen atoms of the second metal layer 36. Therefore, the second metal layer 36 does not come off the insulating film 34a even though the passivation film 39 is deposited on the second metal layer 36. Also, the second metal layer 36 does not come off the insulating film 34a even though ultrasonic cleaning is performed for the capacitative element 38.

Accordingly, the deposition temperature of the passivation film 39 can be increased, and the ultrasonic cleaning can be performed. Also, yield rate and reliability of semiconductor integrated circuits can be increased.

Also, because the insulating film 34a consists of SrTiO$_3$, a small-sized capacitative element can be manufactured as described in the prior art.

Next, a second embodiment is described with reference to FIG. 6.

Figure 6:
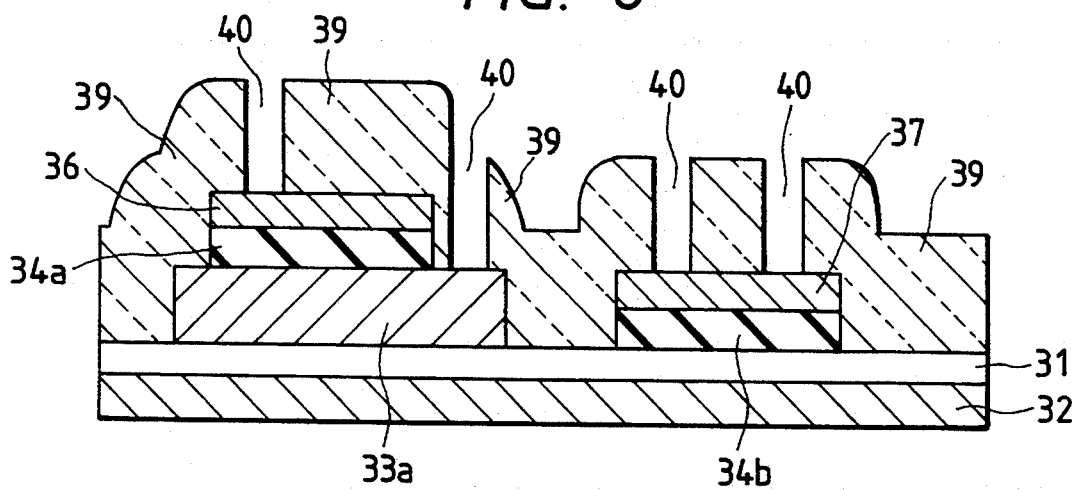
FIG. 6 is a sectional view showing a capacitive element and a thin metal film resistor on a substrate which are manufactured in the same process according to a second embodiment of the present invention.

FIG. 6 is a sectional view showing a capacitative element and a thin metal film resistor on a substrate which are manufactured in the same process according to a second embodiment of the present invention.

The first to third processes are performed in the same manner as the first embodiment shown in FIGS. 4A to 4C. Thereafter, the thin metal film 35 consisting of WSiN is deposited over the entire insulating film 34 in a fourth process of the second embodiment. Thereafter, both the insulating film 34 and the thin metal film 35 are simultaneously etched to form the second metal layer 36 on the insulating film 34a and the thin metal film resistor 37 on an insulating film 34b in a fifth process of the second embodiment. Thereafter, the passivation film 39 is deposited on the second metal layer 36, the thin metal film resistor 37, the first metal layer 33a, and the layer insulation film 31 in a sixth process of the second embodiment. Thereafter, as shown in FIG. 6, the via holes 40 are made in an seventh process of the second embodiment.

Accordingly, the number of processes required to manufacture the capacitative element 38 and the thin metal film resistor 37 is moreover decreased by one in the second embodiment as compared with the first embodiment.

In the first and second embodiments, the passivation film 39 consists of SiO$_2$. However, a material of the passivation film 39 is not limited to SiO$_2$. For example, SiN is useful as the material of the passivation film 39 in place of SiO$_2$. In this case, because the via holes 40 are generally made with CF$_4$ ions according to a reactive ion etching technique, a reactive ion etching stopper layer consisting of metal such as Al is required to be deposited on the second metal film 36 and the thin metal film resistor 37.

Also, the substrate 32 consists of GaAs in the first and second embodiments. However, a material of the substrate 32 is not limited to GaAs. For example, a Si substrate is useful in place of the GaAs substrate 32.

Also, the insulating film 34a consists of SrTiO$_3$ in the first and second embodiments. However, a material of the insulating film 34a is not limited to SrTiO$_3$. For example, Ba$_x$Sr$_{1-x}$TiO$_3$ ($0 \leq X \leq 1$) is useful as the material of the insulating film 34a. In this case, a relative dielectric constant $\epsilon r$ of Ba$_x$Sr$_{1-x}$TiO$_3$ is about 250. Therefore, a capacitative element in which Ba$_x$Sr$_{1-x}$TiO$_3$ is deposited as an insulating film can reliably function as a capacitor in the same manner as the capacitative element 38.

Also, the second metal 36 and the thin metal film resistor 37 respectively consist of WSiN in the first and second embodiments. However, a material of both the second metal 36 and the thin metal film resistor 37 is not limited to WSiN on condition that the material does not reduce the insulating film 34 consisting of SrTiO$_3$. For example, WN is useful as the material of both the second metal 36 and the thin metal film resistor 37. In this case, because all of tungsten atoms are tightly bonded to nitrogen atoms in WN material, the bond of oxygen atoms to titanium atoms or the bond of oxygen atoms to strontium atoms is not disconnected.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A semiconductor integrated circuit, comprising:
   a semiconductor substrate;
   a first metal layer mounted on the semiconductor substrate;
   an insulating film which consists of a Ti-oxide and is mounted on the first metal layer, the Ti-oxide having a high relative dielectric constant;
   a second metal layer mounted on the insulating film, the second metal layer consisting of a refractory metal including tungsten and nitrogen which does not reduce the insulating film and has a high melting point, tungsten atoms being tightly bonded to nitrogen atoms in the second metal layer to prevent oxygen atoms included in the insulating film from diffusing into the second metal layer; and
   a thin metal film resistive element mounted on the semiconductor substrate, the thin metal film resistive element consisting of the refractory metal including tungsten and nitrogen.

2. A circuit according to claim 1 in which the insulating film consists of Ba$_x$Sr$_{1-x}$TiO$_3$ ($0 \leq X \leq 1$).

3. A circuit according to claim 1 in which the refractory metal including tungsten and nitrogen of the second metal layer and the thin metal film resistive element is WSiN.

4. A circuit according to claim 1 in which the refractory metal including tungsten and nitrogen of the second metal layer and the thin metal film resistive element is WN.

5. A circuit according to claim 1 in which the second metal layer is mounted directly on the insulating film, free of intervening layer therebetween.

6. A semiconductor integrated circuit, comprising:
   a semiconductor substrate;

a first metal layer mounted on the semiconductor substrate;

an insulating film which consists of a SrTi-oxide and is mounted on the first metal layer, the SrTi-oxide having a high relative dielectric constant;

a second metal layer mounted on the insulating film, the second metal layer consisting of a refractory metal including tungsten and nitrogen which does not reduce the insulating film and has a high melting point, tungsten atoms being tightly bonded to nitrogen atoms in the second metal layer to prevent oxygen atoms included in the insulating film from diffusing into the second metal layer; and a thin metal film resistive element mounted on the semiconductor substrate, the thin metal film resistive element consisting of the refractory metal including tungsten.

7. A semiconductor integrated circuit, comprising:

a semiconductor substrate;

a first metal layer mounted on the semiconductor substrate;

an insulating film which consists of a BaTi-oxide and is mounted on the first metal layer, the BaTi-oxide having a high relative dielectric constant;

a second metal layer mounted on the insulating film, the second metal layer consisting of a refractory metal including tungsten and nitrogen which is not oxidized by the insulating film and has a high melting point, tungsten atoms being tightly bonded to nitrogen atoms in the second metal layer to prevent oxygen atoms included in the insulating film from diffusing into the second metal layer; and a thin metal film resistive element mounted on the semiconductor substrate, the thin metal film resistive element consisting of the refractory metal including tungsten.

* * * * *

UNITED STATES PATENT AND TRADEMARK OFFICE
CERTIFICATE OF CORRECTION

PATENT NO. : 5,440,174
DATED : August 8, 1995
INVENTOR(S) : Mitsuru NISHITSUJI

It is certified that error appears in the above-indentified patent and that said Letters Patent is hereby corrected as shown below:

Title page, item [54] and Column 1 lines 1-5 title should read:

--     A PLURALITY OF PASSIVE ELEMENTS IN A SEMICONDUCTOR INTEGRATED CIRCUIT IN WHICH PASSIVE ELEMENTS ARE ARRANGED--

Signed and Sealed this

Twenty-eighth Day of November 1995

Attest:

BRUCE LEHMAN

*Attesting Officer*      *Commissioner of Patents and Trademarks*